US 9,587,313 B2

(12) United States Patent
Wada et al.

(10) Patent No.: US 9,587,313 B2
(45) Date of Patent: Mar. 7, 2017

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: HITACHI KOKUSAI ELECTRIC INC., Tokyo (JP)

(72) Inventors: Yuichi Wada, Toyama (JP); Hiroshi Ashihara, Toyama (JP); Hideto Tateno, Toyama (JP); Harunobu Sakuma, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 55 days.

(21) Appl. No.: 14/605,157

(22) Filed: Jan. 26, 2015

(65) Prior Publication Data
US 2015/0132972 A1 May 14, 2015

Related U.S. Application Data

(63) Continuation of application No. PCT/JP2013/070343, filed on Jul. 26, 2013.

(30) Foreign Application Priority Data

Jul. 27, 2012 (JP) ................... 2012-167794

(51) Int. Cl.
*H01L 21/469* (2006.01)
*C23C 16/46* (2006.01)
(Continued)

(52) U.S. Cl.
CPC .......... *C23C 16/46* (2013.01); *C23C 16/4401* (2013.01); *C23C 16/4409* (2013.01);
(Continued)

(58) Field of Classification Search
CPC . C23C 16/46; C23C 16/4401; C23C 16/4409; C23C 16/52; C23C 16/45519;
(Continued)

(56) References Cited

U.S. PATENT DOCUMENTS

| 6,283,175 | B1 | 9/2001 | Shimazu | |
| 7,210,516 | B2* | 5/2007 | Wakita | B22D 7/06 164/259 |
| 7,972,979 | B2* | 7/2011 | Harada | F27B 17/0025 216/84 |
| 8,057,599 | B2* | 11/2011 | Ozaki | C23C 16/4401 118/715 |

(Continued)

FOREIGN PATENT DOCUMENTS

JP 06-349747 A 12/1994
JP 08-064532 A 3/1996
(Continued)

OTHER PUBLICATIONS

Korean Office Action issued on Aug. 25, 2016 in Korean Application No. 10-2015-7000562.

*Primary Examiner* — Tod T Van Roy
*Assistant Examiner* — Vu A Vu
(74) *Attorney, Agent, or Firm* — Volpe and Koenig, P.C.

(57) ABSTRACT

A substrate processing apparatus includes: a reaction tube configured to accommodate a plurality of substrates and to be supplied with a gas generated by vaporizing or turning into mist a solution containing a reactant in a solvent; a lid configured to close the reaction tube; a first heater configured to heat the plurality of substrates; a thermal conductor placed on the lid on an upper surface thereof; a second heater placed outside the reaction tube around a side thereof, the second heater being configured to heat the gas flowing near the lid; and a heating element placed on the lid on a lower surface thereof, the heating element configured to heat the lid.

14 Claims, 8 Drawing Sheets

(51) Int. Cl.
*C23C 16/44* (2006.01)
*C23C 16/52* (2006.01)
*H01L 21/02* (2006.01)

(52) U.S. Cl.
CPC ........ *C23C 16/52* (2013.01); *H01L 21/02164* (2013.01); *H01L 21/02222* (2013.01); *H01L 21/02271* (2013.01); *H01L 21/02282* (2013.01); *H01L 21/02326* (2013.01); *H01L 21/02337* (2013.01)

(58) Field of Classification Search
CPC ......... C23C 16/45565; H01L 21/02164; H01L 21/02222; H01L 21/02271; H01L 21/02282; H01L 21/02326; H01L 21/02337; H01L 21/67103; H01L 21/68785; H01L 21/67109; H01L 21/67115; H01L 21/0532; H01L 21/0262; H01L 21/3065; F23D 14/14; F23D 14/145; F23D 14/28; F23D 2203/005
USPC ....................................................... 438/778
See application file for complete search history.

(56) References Cited

U.S. PATENT DOCUMENTS

| | | | |
|---|---|---|---|
| 8,122,850 | B2 * | 2/2012 | Hishiya ............. H01L 21/02164 118/696 |
| 2001/0018894 | A1 * | 9/2001 | Chang ................. C23C 16/4557 118/724 |
| 2002/0020194 | A1 * | 2/2002 | Makikawa ................ C23C 8/10 65/379 |
| 2006/0021582 | A1 | 2/2006 | Saito et al. |
| 2011/0065288 | A1 | 3/2011 | Harada et al. |

FOREIGN PATENT DOCUMENTS

| | | |
|---|---|---|
| JP | 08-124869 A | 5/1996 |
| JP | 08-162422 A | 6/1996 |
| JP | 2000-068259 A | 3/2000 |
| JP | 2004-119510 A | 4/2004 |
| JP | 2005-079528 A | 3/2005 |
| JP | 2009-132961 A | 6/2009 |
| JP | 2011-086908 A | 4/2011 |

* cited by examiner

SUBSTRATE PROCESSING APPARATUS, METHOD OF MANUFACTURING SEMICONDUCTOR DEVICE, AND NON-TRANSITORY COMPUTER-READABLE RECORDING MEDIUM

BACKGROUND

Technical Field

The present invention relates to a substrate processing apparatus, a method of manufacturing a semiconductor device, and a non-transitory computer-readable recording medium.

Related Art

Traditional manufacturing of semiconductor devices, such as dynamic random-access memories (DRAMs), includes, in some cases, a process where a processing gas is supplied into a reaction tube in which a substrate has been loaded, to form an oxide film on a surface of the substrate. Such a process is performed in a substrate processing apparatus including a reaction tube that accommodates a substrate for processing, a supply unit that supplies a processing gas, generated by vaporizing a liquid material, onto the substrate in the reaction tube, and a heater that heats the substrate in the reaction tube.

SUMMARY

The type of substrate processing apparatus described above may pose a problem that the reaction tube may have an internal area with lower temperatures where it is less likely to be heated by the heater. When the processing gas passes through such a low-temperature area, the gas would be cooled to a temperature below its vaporizing point to re-liquefy.

An object of the invention is to provide a technique that is capable of suppressing re-liquefaction of a processing gas in a reaction tube.

In an aspect of the invention, there is provided a substrate processing apparatus, including: a reaction tube configured to accommodate a plurality of substrates and to be supplied with a gas generated by one of vaporizing or turning into mist a solution containing a reactant dissolved in a solvent; a lid configured to close the reaction tube; a first heater configured to heat the plurality of substrates; a thermal conductor placed on the lid on an upper surface thereof; a second heater placed outside the reaction tube around a side thereof, the second heater being configured to heat the gas flowing near the lid; and a heating element placed on the lid on a lower surface thereof, the heating element being configured to heat the lid.

The technique according to the invention achieves improved manufacturing quality of the semiconductor device with improved manufacturing throughput.

DETAILED DESCRIPTION

An Embodiment of the Invention

An embodiment of the invention will now be described with reference to the drawings.

(1) Arrangement of Substrate Processing Apparatus

Figure 1:
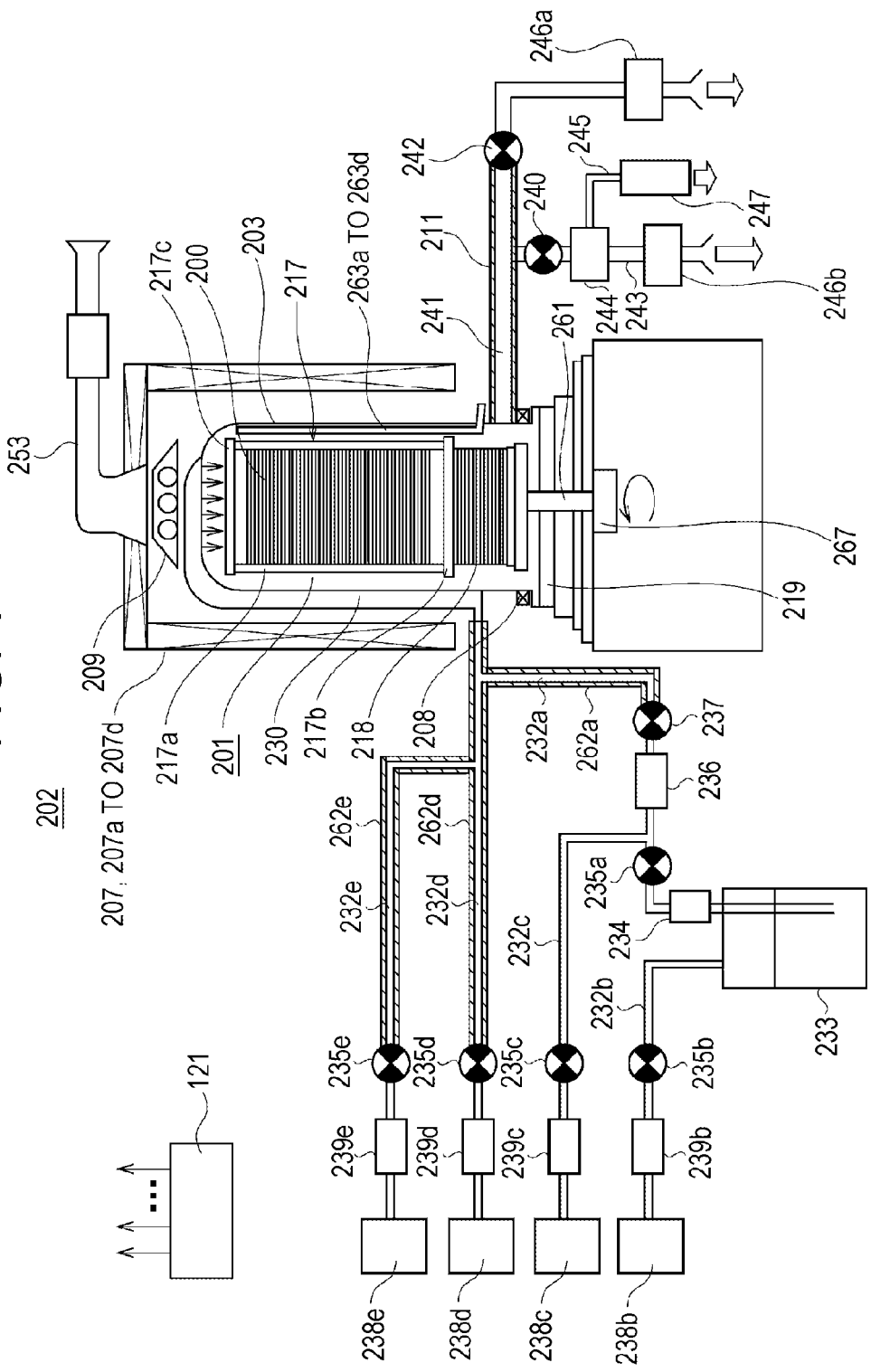
FIG. 1 is a schematic diagram of an arrangement of a substrate processing apparatus according to an embodiment of the invention.
Figure 2:
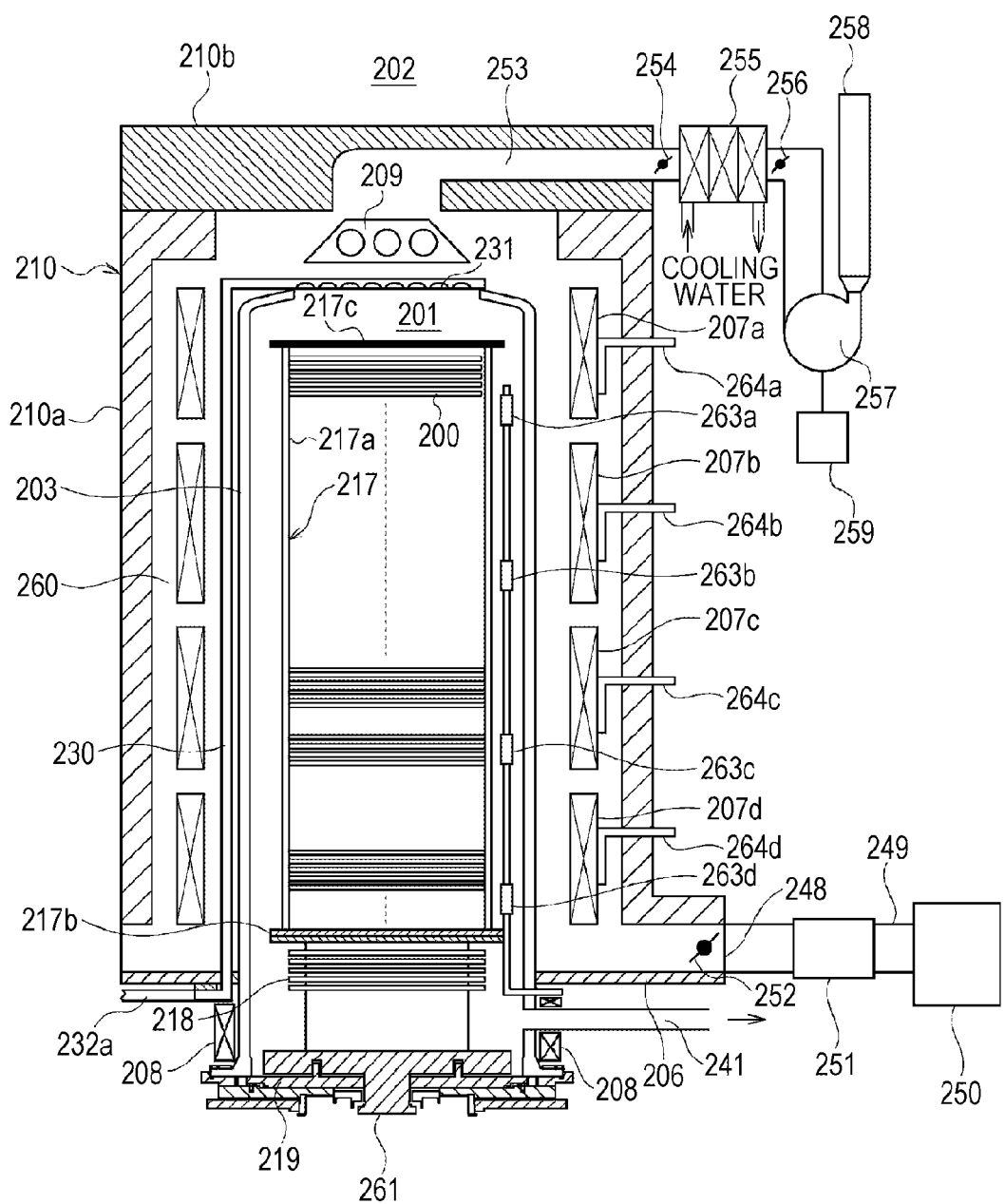
FIG. 2 is a schematic longitudinal sectional view of a processing furnace provided in the substrate processing apparatus according to the embodiment of the invention.

An arrangement of a substrate processing apparatus according to an embodiment will be described below with reference to FIGS. 1 and 2. FIG. 1 is a schematic diagram of an arrangement of the substrate processing apparatus according to this embodiment, providing a longitudinal section of a processing furnace 202. FIG. 2 is a schematic longitudinal sectional view of the processing furnace 202 provided in the substrate processing apparatus according to the embodiment. In the substrate processing apparatus, a process for manufacturing, for example, a semiconductor device is performed.

(Processing Vessel)

As illustrated in FIG. 1, a processing furnace 202 includes a reaction tube 203, which serves as a processing vessel. The reaction tube 203 is made of a heat resistant material, such as quartz ($SiO_2$) and silicon carbide (SiC), and formed into a cylinder with its upper and lower ends open. A processing chamber 201, formed in the hollow of the reaction tube 203, is configured to accommodate a plurality of wafers 200 or substrates held horizontally and in multiple and vertical stages by a boat 217, which will be described hereinafter.

A sealing cap 219 is provided under the reaction tube 203 to serve as a furnace opening lid capable of sealing (closing) the lower end opening (furnace opening) of the reaction tube 203 in a gastight manner.

The sealing cap 219 is vertically under the reaction tube 203 and abuts the lower end of the reaction tube 203. The sealing cap 219 is shaped into a disc.

A boat 217, which serves as a substrate retainer, retains the plurality of wafers 200 in the multiple stages. The boat 217 includes a plurality of poles 217a (three, for example) for retaining the plurality of wafers 200. The plurality of poles 217a is disposed between a bottom plate 217b and a top plate 217c. The wafers 200 are retained by the poles 217a horizontally and in the multiple stages set in a direction of the tube axis with the center of each wafer aligned. The top plate 217c is shaped to have a diameter larger than the maximum outer diameters of the wafers 200 to be retained by the boat 217.

The poles 217a and the top plate 217c may be made with a non-metallic material having high thermal conductivity, such as silicon carbide (SiC), aluminum oxide (AlO), aluminum nitride (AlN), silicon nitride (SiN), and zirconium oxide (ZrO). A non-metallic material with thermal conductivity not less than 10 W/mK in particular may be used. The poles 217a may be made with metal, such as stainless steel (SUS), or quartz. In a case where the poles 217a and the top plate 217c are made with metal, the metal materials are preferably coated with Teflon (registered trademark).

A thermal insulator 218, which is made of a heat resistant material, such as quartz and silicon carbide (SiC), is provided under the boat 217 so that heat is less likely to be transferred from a first heater 207 toward the sealing cap 219. The thermal insulator 218 provides thermal insulation and also serves as a retainer to retain the boat 217. While the thermal insulator 218 includes a plurality of disc-shaped thermal insulation boards held horizontally and in multiple stages as illustrated, the thermal insulator 218 may be a cylindrical-shaped quartz cap, for example. The thermal insulator 218 may be a component of the boat 217.

A boat elevator is provided under the reaction tube 203 as an elevating mechanism to raise and lower the boat 217 for carrying the boat 217 into and out of the reaction tube 203. The boat elevator includes the sealing cap 219 designed to seal the furnace opening when the boat 217 has been raised by the boat elevator.

A boat rotating mechanism 267 to rotate the boat 217 is provided at the sealing cap 219 on the side opposite to the processing chamber 201. The boat rotating mechanism 267 includes a rotating shaft 261 that passes through the sealing cap 219 to be connected to the boat 217. The rotating shaft 261 is configured to rotate the boat 217 and thereby rotate the wafers 200.

(First Heater)

The first heater 207, which is for heating the wafers 200 in the reaction tube 203, is provided outside the reaction tube 203, surrounding side wall surfaces of the reaction tube 203 concentrically. The first heater 207 is supported by a heater base 206. As illustrated in FIG. 2, the first heater 207 includes a first heater unit 207a, a second heater unit 207b, a third heater unit 207c, and a fourth heater unit 207d. The heater units 207a, 207b, 207c, and 207d are provided along the direction of stacking the wafers 200 in the reaction tube 203.

A first temperature sensor 263a, a second temperature sensor 263b, a third temperature sensor 263c, and a fourth temperature sensor 263d, which may be formed with thermocouples, are provided in the reaction tube 203 at places corresponding to the respective heater units. The temperature sensors 263 are placed between the reaction tube 203 and the boat 217. Each of the temperature sensors 263 may be positioned so as to detect the temperature of one of wafers 200 located at the middle of wafers 200 to be heated by each heater unit.

The first heater 207 and the temperature sensors 263 are electrically connected to a controller 121, which will be described hereinafter. The controller 121 controls power to be supplied to the first heater unit 207a, the second heater unit 207b, the third heater unit 207c, and the fourth heater unit 207d at predetermined timings on the basis of temperature information detected by the temperature sensors 263 so that the wafers 200 in the reaction tube 203 have predetermined temperatures. The temperatures of the first heater unit 207a, the second heater unit 207b, the third heater unit 207c, and the fourth heater unit 207d are set and adjusted individually in the manner described above.

(Supply Module)

As illustrated in FIGS. 1 and 2, a supply nozzle 230, in which a reactant passes, is provided between the reaction tube 203 and the first heater 207. The reactant herein refers to a substance supplied onto the wafers 200 in the reaction tube 203 to react with the wafers 200. Hydrogen peroxide ($H_2O_2$), which is generally used as an oxidant, or water ($H_2O$) may be used to serve as a reactant. The supply nozzle 230 is made with, for example, quartz, which has low thermal conductivity. The supply nozzle 230 may have a double pipe structure. The supply nozzle 230 is routed along the exterior wall of the side of the reaction tube 203. The supply nozzle 230 has a gastight upper end (downstream end) placed at the top (upper end opening) of the reaction tube 203. A portion of the supply nozzle 230, located at the upper end opening of the reaction tube 203, has a plurality of supply holes 231 from an upstream side to a downstream side of the portion of the supply nozzle 230 (see FIG. 2). The supply holes 231 are formed so that the reactant supplied in the reaction tube 203 is sprayed onto the top plate 217c of the boat 217 accommodated in the reaction tube 203.

The supply nozzle 230 has an upstream end connected to a downstream end of a reactant supply pipe 232a, which supplies the reactant. The reactant supply pipe 232a is provided with, in the order in its downstream direction, a reactant supply tank 233, a liquid mass flow controller (LMFC) 234, which serves as a liquid flow rate controller (a liquid flow rate control unit), a valve 235a, which is an opening/closing valve, a separator 236, and a valve 237, which is an opening/closing valve. A sub-heater 262a is provided at a position on the reactant supply pipe 232a at least at the downstream side of the valve 237.

The reactant supply tank 233 is connected at its upper portion to a downstream end of a pressure-feed-gas supply pipe 232b, which supplies a pressure-feed gas. The pressure-feed-gas supply pipe 232b is provided with, in the order in its downstream direction, a pressure-feed gas source 238b, a mass flow controller (MFC) 239b, which serves as a flow rate controller (flow rate control unit), and a valve 235b, which is an opening/closing valve.

An inert-gas supply pipe 232c is connected to the reactant supply pipe 232a at a position between the valve 235a and the separator 236. The inert-gas supply pipe 232c is provided with, in the order in its downstream direction, an inert gas source 238c, a mass flow controller (MFC) 239c, which serves as a flow rate controller (flow rate control unit), and a valve 235c, which is an opening/closing valve.

A first gas supply pipe 232d is connected at its downstream end to the reactant supply pipe 232a at a position at the downstream side of the valve 237. The first gas supply pipe 232d is provided with, in the order in its downstream direction, a material gas source 238d, a mass flow controller (MFC) 239d, which serves as a flow rate controller (flow rate control unit), and a valve 235d, which is an opening/closing valve. A sub-heater 262d is provided at a position on the first gas supply pipe 232d at least at the downstream side of the valve 235d. A second gas supply pipe 232e is connected at its downstream end to the first gas supply pipe 232d at a position at the downstream side of the valve 235d. The second gas supply pipe 232e is provided with, in the order in its downstream direction, a material gas source 238e, a mass flow controller (MFC) 239e, which serves as a flow rate controller (flow rate control unit), and a valve 235e, which is an opening/closing valve. A sub-heater 262e is provided at a position on the second gas supply pipe 232e at least at the downstream side of the valve 235e.

The reactant supply pipe 232a, the liquid mass flow controller 234, the valve 235a, the separator 236, the valve 237, and the supply nozzle 230 primarily constitute a reactant supply system. The reactant supply tank 233, the pressure-feed-gas supply pipe 232b, the pressure-feed gas source 238b, the mass flow controller 239b, and the valve 235b may be construed as part of the reactant supply system. The reactant supply system primarily constitutes a supply module.

Additionally, the inert-gas supply pipe 232c, the mass flow controller 239c, and the valve 235c primarily constitute an inert gas supply system. The inert gas source 238c, the reactant supply pipe 232a, the separator 236, the valve 237, and the supply nozzle 230 may be construed as part of the inert gas supply system. Additionally, the first gas supply pipe 232d, the mass flow controller 239d, and the valve 235d primarily constitute a first processing gas supply system. The material gas source 238d, the reactant supply pipe 232a, and the supply nozzle 230 may be construed as part of the first processing gas supply system. Additionally, the second gas supply pipe 232e, the mass flow controller 239e, and the valve 235e constitute a second processing gas supply system. The material gas source 238e, the reactant supply pipe 232a, and the first gas supply pipe 232d, and the supply nozzle 230 may be construed as part of the second processing gas supply system. The inert gas supply system, the first processing gas supply system, and the second processing gas supply system may be construed as part of the supply module.

(State Converter)

A third heater 209 is provided above the reaction tube 203. While the third heater 209 provided outside the reaction tube 203 is described as an example herein, the third heater 209 may be provided in the reaction tube 203. The third heater 209 is configured to heat the top plate 217c of the boat 217. A lamp heater unit may be used as the third heater 209. The third heater 209 is electrically connected to the controller 121 to be described hereinafter. The controller 121 controls power to be supplied to the third heater 209 at a predetermined timing so that the top plate 217c of the boat 217 has predetermined temperatures. The third heater 209 and the top plate 217c primarily constitute a state converter. The state converter converts, for example, a reactant in the liquid state supplied in the reaction tube 203 and a liquid material containing a reactant dissolved in a solvent to the gaseous state. A reactant in the liquid state and a liquid material may be generically referred to simply as a reactant in the liquid state hereinafter.

An operation to vaporize, for example, a reactant in the liquid state to obtain a processing gas (vaporized gas) will now be described. The pressure-feed-gas supply pipe 232b supplies a pressure-feed gas via the mass flow controller 239b and the valve 235b to the reactant supply tank 233. This feeds a liquid material stored in the reactant supply tank 233 into the reactant supply pipe 232a. The liquid material fed from the reactant supply tank 233 into the reactant supply pipe 232a is supplied via the liquid mass flow controller 234, the valve 235a, the separator 236, the valve 237, and the supply nozzle 230 into the reaction tube 203. The liquid material supplied into the reaction tube 203 comes in contact with the top plate 217c, which has been heated by the third heater 209, to vaporize or turn into mist, to form the processing gas (vaporized gas or mist gas). The processing gas is supplied to the wafers 200 in the reaction tube 203 to perform predetermined substrate processing on the wafers 200.

To promote the vaporization of the reactant in the liquid state, the reactant in the liquid state flowing in the reactant supply pipe 232a may be preheated by the sub-heater 262a. In this manner, the reactant in the liquid state can be supplied to the reaction tube 203 in a condition more favorable for the vaporization.

(Exhaust Module)

The reaction tube 203 is connected to an upstream end of a first exhaust pipe 241 to exhaust an atmosphere from the inside of the reaction tube 203 (the inside of the processing chamber 201). The first exhaust pipe 241 is provided with, in the order in its downstream direction, a pressure sensor, which serves as a pressure sensing unit to detect the pressure in the reaction tube 203, an auto pressure controller (APC) valve 242, which serves as a pressure regulator (pressure regulating unit), and a vacuum pump 246a, which serves as a vacuum-exhausting device. The first exhaust pipe 241 is configured in a manner such that the reaction tube 203 can be evacuated by the vacuum pump 246a to have a predetermined internal pressure (the degree of vacuum). The APC valve 242 is an opening/closing valve that can be opened or closed to evacuate or stop evacuating the reaction tube 203 and enables its valve opening to be adjusted to regulate the pressure.

A second exhaust pipe 243 is connected at its upstream end to the first exhaust pipe 241 at a position at the upstream side of the APC valve 242. The second exhaust pipe 243 is provided with, in the order in its downstream direction, a valve 240, which is an opening/closing valve, a separator 244, which separates liquids and gases from an exhaust gas exhausted from the reaction tube 203, and a vacuum pump 246b, which serves as a vacuum-exhausting device. A third exhaust pipe 245, which is connected at its upstream end to the separator 244, is provided with a liquid collecting tank 247. A gas chromatograph may be used as the separator 244.

The first exhaust pipe 241, the second exhaust pipe 243, the separator 244, the liquid collecting tank 247, the APC valve 242, the valve 240, and the pressure sensor primarily constitute an exhaust module. The vacuum pump 246a and the vacuum pump 246b may be construed as part of the exhaust module.

(Reaction Tube Cooling Module)

As illustrated in FIG. 2, a thermal insulating member 210 is provided around the outer circumference of the first heater 207, covering the reaction tube 203 and the first heater 207. The thermal insulating member 210 includes a side thermal insulating member 210a, which surrounds the side wall of the reaction tube 203, and a top thermal insulating member 210b, which covers the upper end of the reaction tube 203. The side thermal insulating member 210a and the top thermal insulating member 210b are connected in a gastight manner. The side thermal insulating member 210a and the top thermal insulating member 210b may be formed in one piece to form the thermal insulating member 210. The thermal insulating member 210 is made with a heat resistant material, such as quartz and silicon carbide.

A supply port 248 is formed below the side thermal insulating member 210a to supply a cooling gas. While the supply port 248 is formed with a lower end of the side thermal insulating member 210a and the heater base 206 in the embodiment, the supply port 248 may be formed by providing an opening in the side thermal insulating member 210a. The supply port 248 is connected to a downstream end of a cooling gas supply pipe 249. The cooling gas supply pipe 249 is provided with, in the order in its downstream direction, a cooling gas source 250, a mass flow controller (MFC) 251, which is a flow rate controller (flow rate control unit), and a shutter 252, which is a shut-off valve.

The cooling gas supply pipe 249 and the mass flow controller 251 primarily constitute a cooling gas supply system. The cooling gas source 250 and the shutter 252 may be construed as part of the cooling gas supply system.

The top thermal insulating member 210b is connected to an upstream end of a cooling gas exhaust pipe 253 to exhaust an atmosphere from a space 260 between the reaction tube 203 and the thermal insulating member 210. The cooling gas exhaust pipe 253 is provided with, in the order in its downstream direction, a shutter 254, which is a shut-off valve, a radiator 255, which allows cooling water or the like to be circulated to cool an exhaust gas flowing in the cooling gas exhaust pipe 253, a shutter 256, which is a shut-off valve, a blower 257, which enables the exhaust gas to flow in the cooling gas exhaust pipe 253 from its upstream side to its downstream side, and an exhaust mechanism 258 including an exhaust port through which the exhaust gas is exhausted from the processing furnace 202 to the outside. The blower 257 is connected to a blower rotating mechanism 259, such as an inverter, to rotate the blower 257.

The cooling gas exhaust pipe 253, the radiator 255, the blower 257, and the exhaust mechanism. 258 primarily constitute a cooling gas exhaust system that exhaust the atmosphere in the space 260 between the thermal insulating member 210 and the reaction tube 203. The shutter 254 and the shutter 256 may be construed as part of the cooling gas exhaust system. The cooling gas supply system and the cooling gas exhaust system constitute the reaction tube cooling module.

(Second Heater)

When hydrogen peroxide, for example, is used as a reactant to generate a hydrogen peroxide gas by vaporizing or turning into mist a hydrogen peroxide solution, which is the liquid state of the hydrogen peroxide, so that the hydrogen peroxide gas is used as a processing gas, the hydrogen peroxide gas may be cooled in the reaction tube 203 to a temperature below the vaporizing point of hydrogen peroxide to re-liquefy in some cases.

Figure 11:
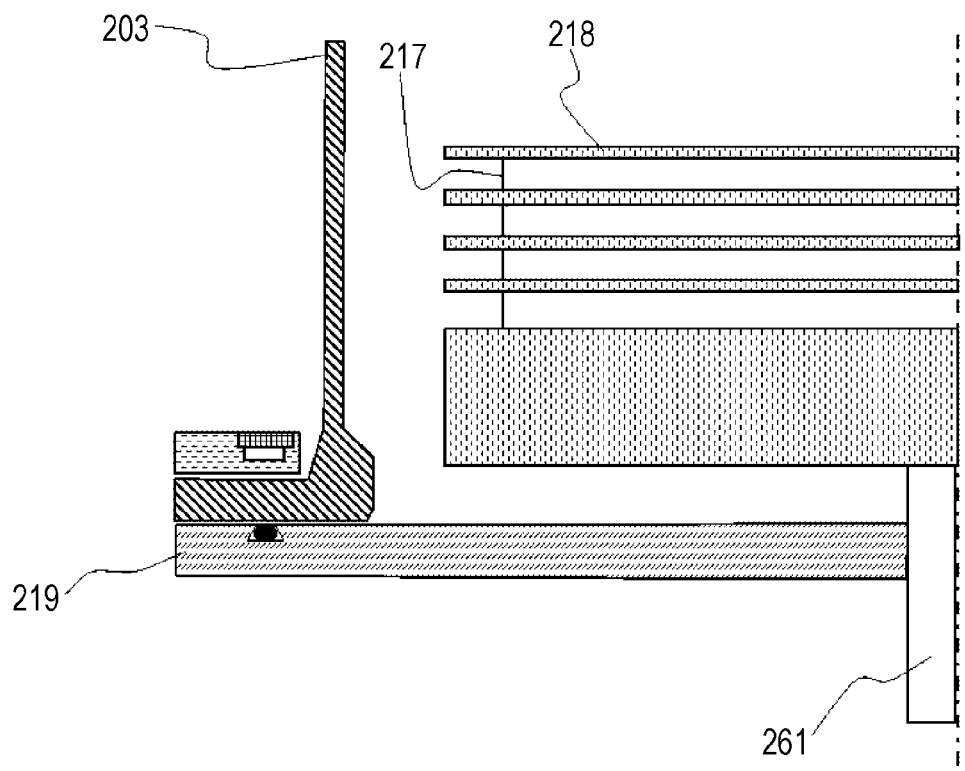
FIG. 11 is a schematic diagram of an arrangement near a furnace opening in a comparative example.

Such re-liquefaction of a hydrogen peroxide gas often occurs outside an area heated by the first heater 207 in the reaction tube 203. Since the first heater 207 is provided to heat the wafers 200 in the reaction tube 203 as described above, an area accommodating the wafers 200 in the reaction tube 203 is heated by the first heater 207. An area outside the area accommodating the wafers 200 in the reaction tube 203, however, is less likely to be heated by the first heater 207. As a result, the hydrogen peroxide gas is cooled when passing through a low-temperature area generated in the area outside the area heated by the first heater 207 in the reaction tube 203, resulting in the re-liquefaction. In a reference example illustrated in FIG. 11, a processing furnace 202 provided in a traditional substrate processing apparatus includes no heater to heat a processing gas flowing in a reaction tube 203 at a downstream side of the reaction tube 203 (i.e., in an area accommodating a thermal insulator 218 in the reaction tube 203). This sometimes causes the processing gas to re-liquefy in the reaction tube 203 at the downstream side.

The liquid resulting from the re-liquefaction of the hydrogen peroxide gas (also simply referred to as "liquid" hereinafter) may collect in the reaction tube 203 at its bottom (on an upper surface of a sealing cap 219). This causes the re-liquefied hydrogen peroxide to react with the sealing cap 219 to inflict damage on the sealing cap 219.

Additionally, when the sealing cap 219 is lowered to open the furnace opening (the lower end opening of the reaction tube 203) in order to unload the boat 217 to the outside of the reaction tube 203, the liquid, if having collected on the sealing cap 219, may come down from the reaction tube 203 through the furnace opening to the outside of the reaction tube 203. This may result in damage to peripheral members of the furnace opening of the processing furnace 202 and inhibit an operator and the like from safely entering an area in proximity to the processing furnace 202.

A hydrogen peroxide solution is manufactured with, for example, hydrogen peroxide (H2O2) as a material (reactant), which is solid or liquid at ordinary temperatures, and water (H2O) as a solvent by dissolving the hydrogen peroxide in the water. In other words, the hydrogen peroxide solution is made of hydrogen peroxide and water, which have mutually different vaporizing points. Thus, a liquid resulting from the re-liquefaction of a hydrogen peroxide gas may have a higher concentration of the hydrogen peroxide than the hydrogen peroxide solution to be supplied in the reaction tube 203.

The liquid resulting from the re-liquefaction of the hydrogen peroxide gas may be vaporized again in the reaction tube 203 to generate a re-vaporized gas. Since hydrogen peroxide and water have mutually different vaporizing points as described above, the re-vaporized gas may have a higher concentration of the hydrogen peroxide than the hydrogen peroxide gas to be supplied onto the wafers 200.

Thus, the reaction tube 203 containing the re-vaporized gas may have nonuniform concentrations of hydrogen peroxide gas. This may result in nonuniformity in the substrate processing among the wafers 200 in the reaction tube 203, leading to variability in substrate processing characteristics. This may also lead to nonuniformity in the substrate processing among different lots.

Additionally, repeated re-liquefaction and revaporization of the hydrogen peroxide may increase the concentration of the hydrogen peroxide. This may result in higher probability of explosion or combustion due to the increased concentration of the hydrogen peroxide solution.

Figure 3:
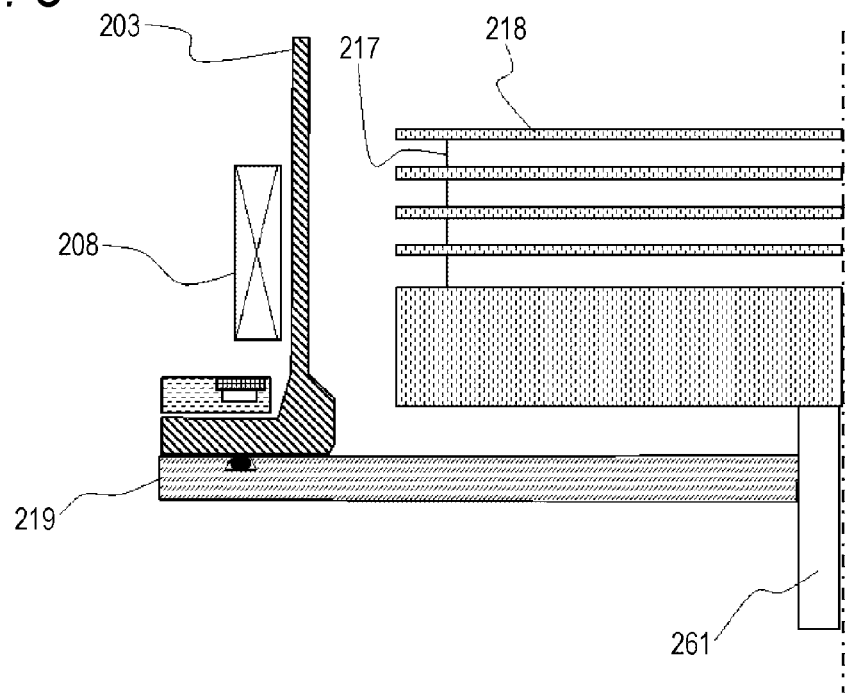
FIG. 3 is a schematic diagram of an arrangement near a furnace opening according to the embodiment of the invention.

In light of this, a second heater 208 is provided, as illustrated in FIGS. 1, 2 and 3, to heat the area outside the area heated by the first heater 207. The second heater 208 is placed outside (around the outer circumference of) a lower portion of the reaction tube 203, surrounding side wall surfaces of the reaction tube 203 concentrically.

The second heater 208 may include a resistance heating body and/or a radiation heating body. The resistance heating body may be made with a Nichrome wire, a Kanthal wire, SiC, or tungsten. The radiation heating body preferably radiates mid-wavelength infrared, which is likely to be absorbed by water molecules (H2O). The radiation heating body is formed with, for example, a Kanthal wire heater, a carbon heater, a SiC heater, a lamp heater including tungsten, a halogen lamp, or the like.

The second heater 208 is configured to heat the hydrogen peroxide gas, which flows toward the exhaust module from the top (at an upstream side) to the bottom (at a downstream side) of the reaction tube 203, at the downstream side in the reaction tube 203 (i.e., in an area accommodating the thermal insulator 218 in the reaction tube 203). Additionally, the second heater 208 is configured to heat the sealing cap 219 that seals the lower end opening of the reaction tube 203, the lower portion of the reaction tube 203, and internal members of the reaction tube 203 near the lower portion thereof, such as the thermal insulator 218 positioned at the bottom of the reaction tube 203 therein. In other words, the second heater 208 is positioned below the bottom plate 217b with the boat 217 loaded in the processing chamber 201.

Figure 4:
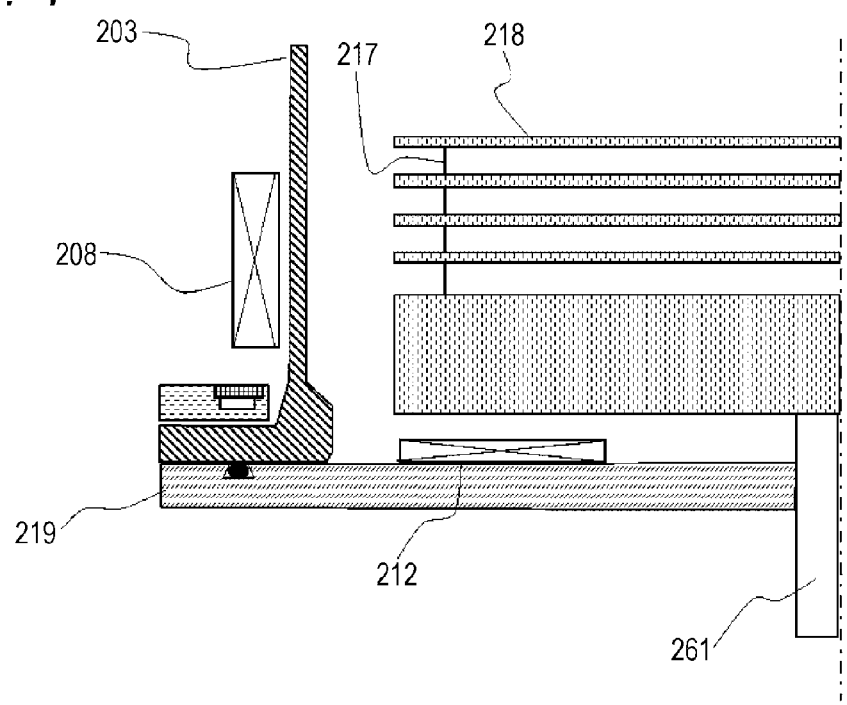
FIG. 4 is a schematic diagram of an arrangement near the furnace opening according to another embodiment of the invention.
Figure 5:
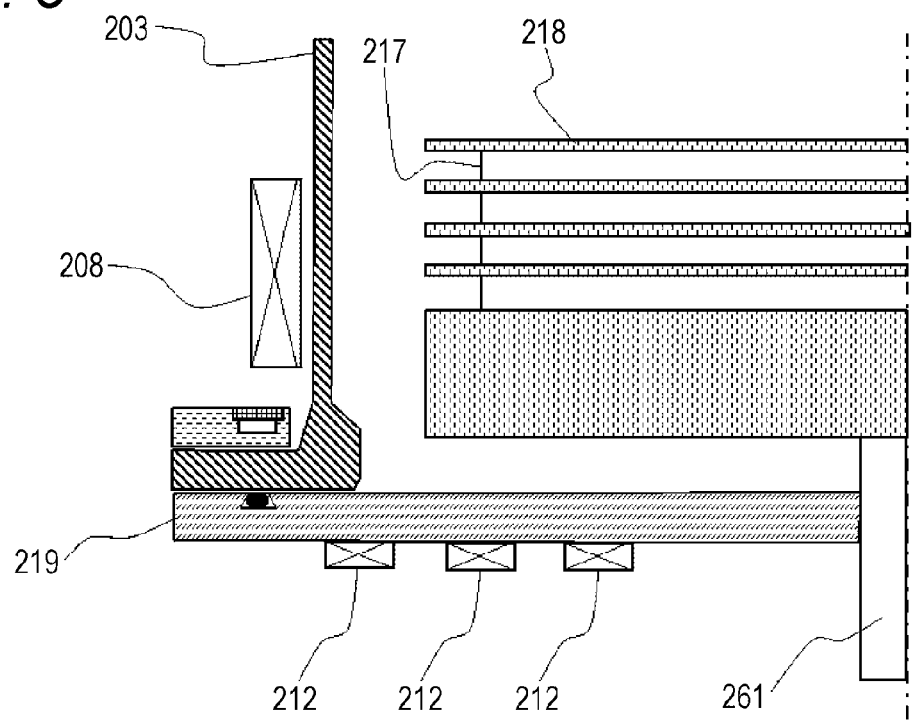
FIG. 5 is a schematic diagram of an arrangement near the furnace opening according to yet another embodiment of the invention.

As illustrated in FIG. 4, a heating element 212 may be provided on a member that seals the lower end opening of the reaction tube 203 (i.e. the sealing cap 219). As illustrated in FIG. 5, heating elements 212 may be provided, for example, outside the sealing cap 219. As illustrated in FIG. 4, two heating elements 212 may be provided, with one outside the lower portion of the reaction tube 203 and the other inside the sealing cap 219. Furthermore, three or more heating elements 212 may be provided.

The second heater 208 is electrically connected to the controller 121, which will be described hereinafter. The controller 121 is configured to control power to be supplied to the second heater 208 at a predetermined timing to maintain temperatures (from 150° C. to 170° C., for example) at which the liquefaction of the processing gas (hydrogen peroxide gas) in the reaction tube 203 can be suppressed.

(Control Unit)

Figure 9:
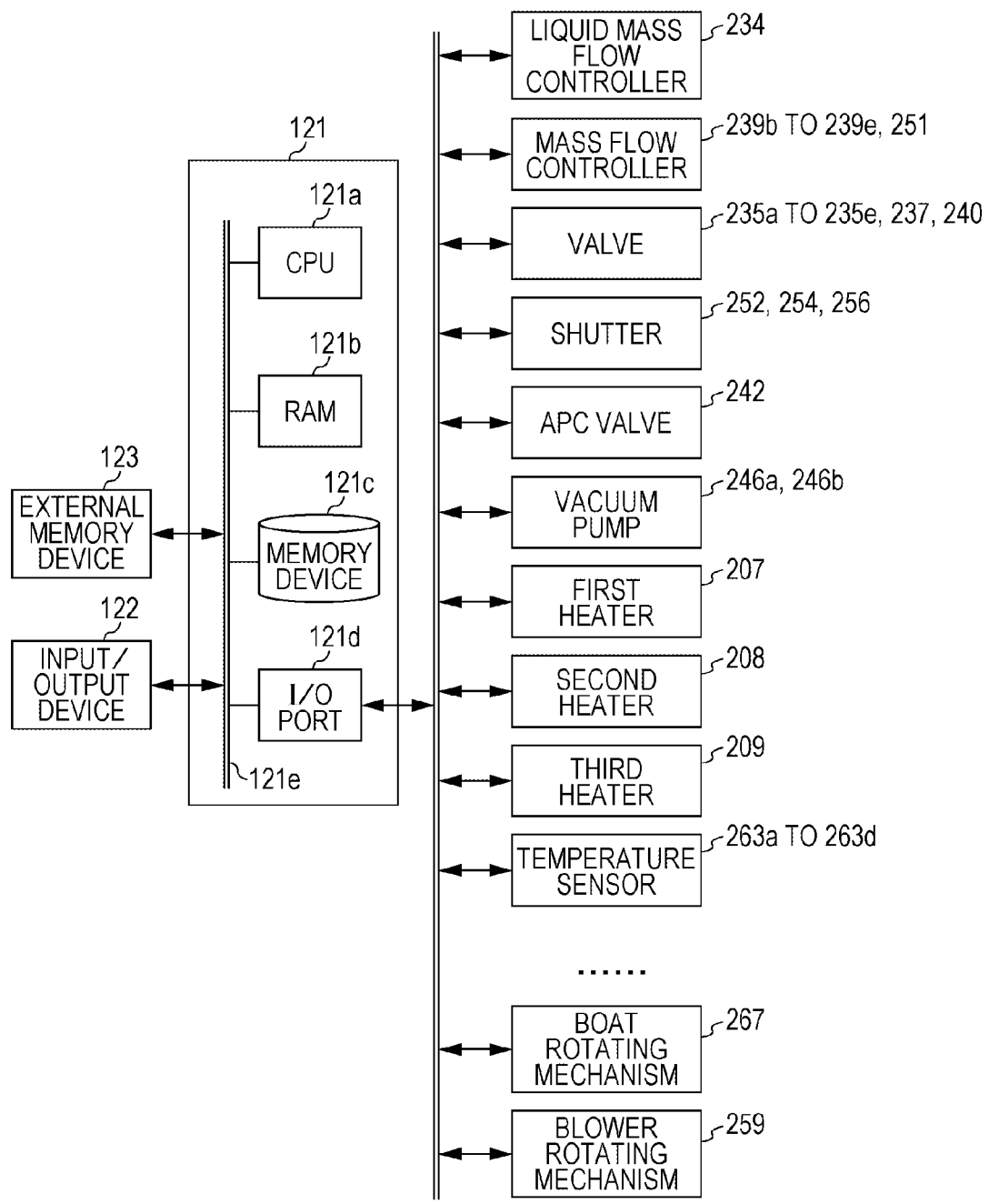
FIG. 9 is a schematic diagram of an arrangement of a controller of the substrate processing apparatus suitably usable in the embodiments of the invention.

As illustrated in FIG. 9, the controller 121, which is a control unit (control means), is configured as a computer including a central processing unit (CPU) 121a, a random access memory (RAM) 121b, a memory device 121c, and an I/O port 121d. The RAM 121b, the memory device 121c, and the I/O port 121d are configured to exchange data via an internal bus 121e with the CPU 121a. The controller 121 is connected to an input/output device 122 configured as, for example, a touch panel.

The memory device 121c is configured with, for example, a flash memory and a hard disk drive (HDD). The memory device 121c stores a control program that controls an operation of the substrate processing apparatus, a process recipe describing a procedure and a condition for the substrate processing to be described hereinafter, and the like in a readable manner. The process recipe, which is configured to enable the controller 121 to execute procedures in a substrate treatment process to be described hereinafter to obtain a predetermined result, serves as a program. The process recipe and the control program may be generically referred to simply as a program hereinafter. The term "program" as used herein may include a process recipe only, a control program only, or the both. The RAM 121b serves as a memory area (work area) in which a program and data read by the CPU 121a are temporarily retained.

The I/O port 121d is connected to the liquid mass flow controller 234, the mass flow controllers 239b, 239c, 239d, 239e, and 251, the valves 235a, 235b, 235c, 235d, 235e, 237, and 240, the shutters 252, 254, and 256, the APC valve 242, the first heater 207, the second heater 208, the third heater 209, the heating element 212, the blower rotating mechanism 259, the first temperature sensor 263a, the second temperature sensor 263b, the third temperature sensor 263c, the fourth temperature sensor 263d, the boat rotating mechanism 267, and the like.

The CPU 121a reads a control program from the memory device 121c to execute it and reads a process recipe from the memory device 121c in response to an operation command input into the input/output device 122. The CPU 121a then controls an operation of the liquid mass flow controller 234 to adjust the flow rate of a liquid material, operations of the mass flow controllers 239b, 239c, 239d, 239e, and 251 to adjust the flow rates of respective gases, opening/closing operations of the valves 235a, 235b, 235c, 235d, 235e, 237, and 240, shut-off operations of the shutters 252, 254, and 256, an operation of the APC valve 242 to adjust its opening, an operation to adjust the temperature of the first heater 207 on the basis of the first temperature sensor 263a, the second temperature sensor 263b, the third temperature sensor 263c, and the fourth temperature sensor 263d, operations to adjust the temperatures of the second heater 208 and the third heater 209 on the basis of the temperature sensors, starting and stopping of the vacuum pumps 246a and 246b, an operation to adjust the rotating speed of the blower rotating mechanism 259, an operation to adjust the rotating speed of the boat rotating mechanism 267, and the like according to the process recipe that has been read.

The controller 121 may be a dedicated computer or a general purpose computer. For example, an external memory device 123 (a magnetic disk, such as a magnetic tape, a flexible disk, and a hard disk drive, an optical disk, such as a CD and a DVD, a magneto-optical disk, such as an MO, and a semiconductor memory, such as a USB flash drive and a memory card, for example) having stored the program may be used to install the program in a general purpose computer in order to configure the controller 121 according to the embodiment. Note that a program may be installed in a computer in any other way than via the external memory device 123. For example, a program may be supplied via communication means, such as the Internet and a dedicated line, without the use of the external memory device 123. The memory device 121c and the external memory device 123 are each configured as a non-transitory computer-readable recording medium. The memory device 121c and the external memory device 123 may be each generically referred to simply as non-transitory computer-readable recording medium herein. The term "non-transitory computer-readable recording medium" as used herein may include the memory device 121c only, the external memory device 123 only, or the both.

(2) Substrate Treatment Process

Figure 10:
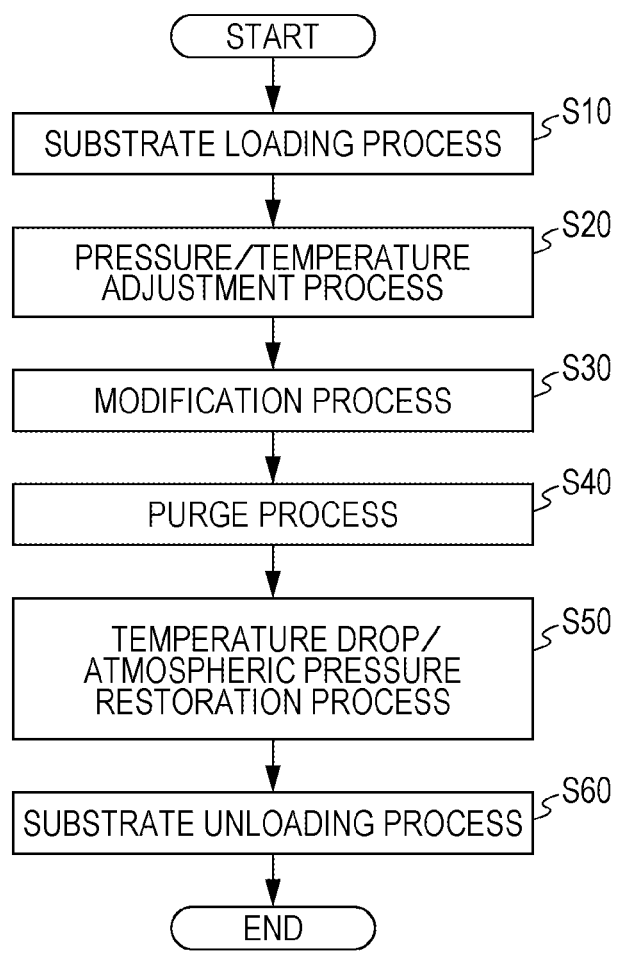
FIG. 10 is a flowchart of a substrate treatment process according to an embodiment of the invention.

With reference to FIG. 10, a substrate treatment process performed as part of the manufacturing process of a semiconductor device according to the embodiment will now be described. This process is performed in the substrate processing apparatus described above. As an exemplified substrate treatment process in the embodiment, a process (modification process) will be described which modifies (oxidizes) a Si film, formed on each of the wafers 200 or the substrates, with hydrogen peroxide serving as a reactant to obtain a SiO film. Note that operations of the components of the substrate processing apparatus are controlled by the controller 121 in the description hereinafter.

The substrates used as the wafers 200 each have features or a recess/protrusion structure with a silicon (Si)-containing film formed in a recess (groove). The silicon-containing film is formed by supplying a material containing silicon to fill the recess (groove). The silicon-containing film contains the Si element, the nitrogen (N) element, and the hydrogen (H) element, and the film in some cases also contains carbon (C) and other impurities. The material containing silicon is preferably a material containing a silazane bond (—Si—N-bond) and more preferably polysilazane ($SiH_2NH$). The substrate having features refers to a silicon substrate having a structure with a high aspect ratio, such as vertically deep grooves (recesses) or laterally narrow grooves (recesses) with, for example, an approximately 10 nm to 50 nm width.

The polysilazane is a material that replaces SOG used traditionally. The polysilazane can be obtained through a catalytic reaction between, for example, dichlorosilane, trichlorosilane, and ammonia, and it is applied onto a substrate with a spin coater to form a thin film. The thickness of the film is adjusted through the molecular weight and viscosity of the polysilazane and the rotation speed of the coater. By supplying water to the polysilazane, the silicon oxide film can be formed.

A hydrogen peroxide solution has higher activation energy and more oxygen atoms in one molecule than water vapor (water, H2O), yielding high oxidative power. Thus, the use of the hydrogen peroxide gas as the processing gas allows oxygen atoms (O) to reach the depths of the films formed in the grooves (the bottoms of the grooves) of the wafers 200. This achieves greater uniformity in the modification between the surfaces and the depths of the films of the wafers 200. In other words, greater uniformity in the substrate processing can be achieved in this manner between the surfaces and the depths of the films of the wafers 200, leading to uniform properties, such as permittivity, of the wafers 200 after the modification. Additionally, the modification process can be performed at low temperatures from 40° C. to 100° C., and thereby performance degradation of circuits formed on the wafers 200 can be suppressed. As used in the description of the embodiment, hydrogen peroxide, used as reactant, vaporized or turned into mist (i.e. the hydrogen peroxide in the gaseous state) is referred to as a hydrogen peroxide gas, and the hydrogen peroxide in the liquid state is referred to as a hydrogen peroxide solution.

(Substrate Loading Process (S10))

A specified number of the wafers 200 is loaded into the boat 217 (wafer charging). The boat 217 retaining the plurality of wafers 200 is then raised with the boat elevator to be loaded into the reaction tube 203 (in the processing chamber 201) (boat loading). This seals the furnace opening, which is the opening of the processing furnace 202, with the sealing cap 219.

(Pressure/Temperature Adjustment Process (S20))

The reaction tube 203 is evacuated with the vacuum pump 246a and/or the vacuum pump 246b so as to achieve a desired internal pressure (the degree of vacuum). The internal pressure of the reaction tube 203 is measured with the pressure sensor, and a resultant measured pressure is used to perform feedback control on the opening of the APC valve 242 and the opening/closing of the valve 240 (pressure regulation).

The wafers 200 accommodated in the reaction tube 203 are heated with the first heater 207 so as to achieve desired temperatures (from 40° C. to 100° C., for example). To achieve the desired temperatures of the wafers 200 in the reaction tube 203, the temperature information detected by the first temperature sensor 263a, the second temperature sensor 263b, the third temperature sensor 263c, and the fourth temperature sensor 263d is used to perform feedback control on the power to be supplied to the first heater unit 207a, the second heater unit 207b, the third heater unit 207c, and the fourth heater unit 207d included in the first heater 207 (temperature adjustment). The control is performed so that the first heater unit 207a, the second heater unit 207b, the third heater unit 207c, and the fourth heater unit 207d are provided with an identical temperature setting. Furthermore, the second heater 208 is controlled so that the reaction tube 203 (the lower portion of the reaction tube 203 in particular) has internal temperatures that allow no re-liquefaction of a hydrogen peroxide gas.

As the wafers 200 are being heated, the boat rotating mechanism 267 is actuated to start rotating the boat 217. The rotating speed of the boat 217 is controlled by the controller 121. The boat 217 is rotated at all times at least until a modification process (S30) to be described hereinafter is finished.

(Modification Process (S30))

When the wafers 200 have achieved the desired temperatures and the boat 217 has achieved a desired rotating speed, the reactant supply pipe 232a starts supplying a hydrogen peroxide solution into the reaction tube 203. To do so, the valves 235c, 235d, and 235e are closed and the valve 235b is opened. Then, the pressure-feed gas source 238b supplies a pressure-feed gas into the reactant supply tank 233 with its flow rate controlled by the mass flow controller 239b. The valves 235a and 237 are opened to allow the hydrogen peroxide solution stored in the reactant supply tank 233 to flow in the reactant supply pipe 232a, with its flow rate controlled by the liquid mass flow controller 234, through the separator 236, the supply nozzle 230, and the supply holes 231 into the reaction tube 203. An inert gas, such as nitrogen (N2) gas, and a rare gas, such as He gas, Ne gas, and Ar gas, may be used as the pressure-feed gas.

The hydrogen peroxide solution, not a hydrogen peroxide gas, is passed through the supply nozzle 230 for a reason described below. The passage of a hydrogen peroxide gas through the supply nozzle 230 may result in variations in concentration of the hydrogen peroxide gas due to the heat condition of the supply nozzle 230. This may lead to difficulty in performing the substrate processing with good reproducibility. Additionally, the passage of a hydrogen peroxide gas with a high concentration of hydrogen peroxide through the supply nozzle 230 may corrode the supply nozzle 230. Foreign substances generated from the corrosion may adversely affect the substrate processing, such as film processing. Thus, the hydrogen peroxide solution is passed through the supply nozzle 230 in the embodiment.

The hydrogen peroxide solution supplied through the supply nozzle 230 into the reaction tube 203 comes in contact with the top plate 217c of the boat 217, heated by the third heater 209, to generate a hydrogen peroxide gas (i.e. hydrogen peroxide solution gas), which is the processing gas.

The hydrogen peroxide gas is supplied onto the wafers 200 to modify the Si films formed on the wafers 200 through oxidation reaction between the hydrogen peroxide gas and the surfaces of the wafers 200 to obtain the SiO films.

As the hydrogen peroxide solution is being supplied into the reaction tube 203, an exhaust gas is exhausted through the vacuum pump 246b and the liquid collecting tank 247. To do so, the APC valve 242 is closed and the valve 240 is opened, so that the exhaust gas from the reaction tube 203 is passed through the first exhaust pipe 241 and then the second exhaust pipe 243 into the separator 244. The separator 244 separates a liquid containing the hydrogen peroxide and a gas containing no hydrogen peroxide from the exhaust gas and allows the gas to be exhausted through the vacuum pump 246b and the liquid to be collected in the liquid collecting tank 247.

Note that, when the hydrogen peroxide solution is supplied into the reaction tube 203, the valve 240 and the APC valve 242 may be closed to pressurize the reaction tube 203. This allows the atmosphere of the hydrogen peroxide solution to be uniform in the reaction tube 203.

After the elapse of a predetermined period of time, the valves 235a, 235b, and 237 are closed to stop supplying the hydrogen peroxide solution to the reaction tube 203.

(Purge Process (S40))

When the modification process (S30) is finished, the APC valve 242 is closed and the valve 240 is opened to evacuate the reaction tube 203 and exhaust the remainder of the hydrogen peroxide gas from the reaction tube 203. To do so, the valve 235a is closed and the valves 235c and 237 are opened, so that N2 gas (inert gas), serving as a purge gas, is supplied with its flow rate controlled by the mass flow controller 239c through the inert-gas supply pipe 232c and the supply nozzle 230 into the reaction tube 203. An inert gas, such as nitrogen (N2) gas, and a rare gas, such as He gas, Ne gas, and Ar gas, may be used as the purge gas. In this manner, the exhausting of the residual gas from the reaction tube 203 can be promoted. Additionally, the passage of the N2 gas through the supply nozzle 230 can force the remainder of the hydrogen peroxide solution (the hydrogen peroxide in the liquid state) out of the supply nozzle 230, so that the hydrogen peroxide solution is removed. During this process, the opening of the APC valve 242 and the opening/closing of the valve 240 may be adjusted to exhaust the gases through the vacuum pump 246a.

(Temperature Drop/Atmospheric Pressure Restoration Process (S50))

When the purge process (S40) is finished, the valve 240 and/or the APC valve 242 are/is opened to restore an atmospheric pressure in the reaction tube 203, and while doing so, the temperatures of the wafers 200 are allowed to drop to predetermined temperatures (around room temperatures). Specifically, with the valve 235c kept open, the N2 gas, which is an inert gas, is supplied into the reaction tube 203 to increase the pressure in the reaction tube 203 to the atmospheric pressure. The power to be supplied to the first heater 207 and the third heater 209 is controlled to allow the temperatures of the wafers 200 to drop.

While the temperatures of the wafers 200 are allowed to drop, the shutters 252, 254, and 256 may be opened with the blower 257 operating, so that a cooling gas is supplied, with its flow rate controlled by the mass flow controller 251, through the cooling gas supply pipe 249 into the space 260 between the reaction tube 203 and the thermal insulating member 210 to be exhausted through the cooling gas exhaust pipe 253. N2 gas, a rare gas, such as He gas, Ne gas, and Ar gas, or air may be used alone or mixed as the cooling gas. In this manner, the space 260 can be cooled rapidly, allowing the reaction tube 203 and the first heater 207 positioned in the space 260 to be cooled in a short period of time. The temperatures of the wafers 200 in the reaction tube 203 are also allowed to drop in a short period of time.

Alternatively, N2 gas may be supplied through the cooling gas supply pipe 249 into the space 260 with the shutters 254 and 256 closed until the space 260 is filled with the cooling gas and cooled, and, then, the shutters 254 and 256 are opened with the blower 257 operating to allow the cooling gas in the space 260 to be exhausted through the cooling gas exhaust pipe 253.

(Substrate Unloading Process (S60))

Subsequently, the sealing cap 219 is lowered by the boat elevator to open the lower end of the reaction tube 203, and the processed wafers 200 as retained by the boat 217 are unloaded through the lower end of the reaction tube 203 to the outside of the reaction tube 203 (processing chamber 201) (boat unloading). Then, the processed wafers 200 are removed from the boat 217 (wafer discharging) to complete the substrate treatment process according to the embodiment.

As described above, through the heating of the reaction tube 203 with the first heater 207 and the second heater 208, the low-temperature areas in the reaction tube 203 are reduced, and, thus, the cooling of the hydrogen peroxide gas in the reaction tube 203 below the vaporizing point can be suppressed. Hence, the re-liquefaction of the hydrogen peroxide gas in the reaction tube 203 can be suppressed.

Thus, the collecting of the liquid resulting from the re-liquefaction of the hydrogen peroxide gas on the sealing cap 219 can be reduced. This can reduce the reacting of the sealing cap 219 with the hydrogen peroxide contained in the liquid and resulting damage to the sealing cap 219. Additionally, when the sealing cap 219 is lowered to open the furnace opening (the lower end opening of the reaction tube 203) in order to unload the boat 217 to the outside of the reaction tube 203, the coming down of the liquid having collected on the sealing cap 219 through the furnace opening to the outside of the reaction tube 203 can be reduced. As a result, damage to the peripheral members of the processing furnace 202 due to the hydrogen peroxide can be reduced. Additionally, an operator and the like can enter an area in proximity to the processing furnace 202 safely.

Additionally, the vaporizing in the reaction tube 203 of the liquid resulting from the re-liquefaction of the hydrogen peroxide gas and the generating of a re-vaporized gas having a high concentration of hydrogen peroxide can be reduced. Thus, a uniform concentration of the hydrogen peroxide solution in the reaction tube 203 can be achieved, leading to uniformity in the substrate processing among the wafers 200 in the reaction tube 203 and among different lots.

Additionally, the probability of explosion or combustion due to the increased concentration of the hydrogen peroxide solution is reduced because of a reduced chance of increasing the concentration of the hydrogen peroxide solution.

Additionally, as illustrated in FIG. 1, a sub-heater 211 may be provided at a position on the first exhaust pipe 241 at least at the upstream side of the APC valve 242 to serve as a heater to heat the first exhaust pipe 241. By heating the sub-heater 211 to heat the first exhaust pipe 241, the low-temperature areas in the reaction tube 203 are further reduced, and, thus, the re-liquefaction of the hydrogen peroxide gas in the reaction tube 203 can be suppressed. Note that the sub-heater 211 may be construed as part of the second heater 208.

Other Embodiments of the Invention

Although the invention has been described based on an embodiment, the invention is not limited thereto, and various modifications are possible without departing from the spirit of the invention.

A hydrogen peroxide gas is used as the processing gas in the embodiment described above, but the invention is not limited thereto. The processing gas may be a gas generated by vaporizing a solution (a reactant in the liquid state) containing a material (the reactant), which is solid or liquid at ordinary temperatures, dissolved in a solvent. Additionally, use of a material (reactant) having a vaporizing point different from that of a solvent facilitates producing the effects of the embodiment described above. Additionally, the vaporized gas, which serves as the processing gas, is not limited to a gas having increased concentration of a material after the re-liquefaction and may be a gas having reduced concentration of a material after the re-liquefaction. With such a processing gas, the uniformity can be achieved in the concentration of the processing gas in the reaction tube 203.

The oxidant is not limited to the hydrogen peroxide gas and may be gaseous water vapor (H2O) generated by heating a gas containing the hydrogen element (H) (hydrogen-containing gas), such as hydrogen (H2) gas, and a gas containing the oxygen element (O) (oxygen-containing gas), such as oxygen (O2) gas. To generate such water vapor, the valves 235a, 235b, and 237 may be closed and the valves 235d and 235e may be opened to supply the H2 gas and the O2 gas, with their flow rates controlled by the mass flow controllers 239d and 239e, respectively, through the first gas supply pipe 232d and the second gas supply pipe 232e, respectively, into the reaction tube 203. The H2 gas and the O2 gas supplied into the reaction tube 203, then, come in contact with the top plate 217c of the boat 217, heated by the third heater 209, to turn into the water vapor, which is supplied to the wafers 200 to modify the Si films on the wafers to SiO films. Ozone (O3) gas or water vapor (H2O), for example, may be used as the oxygen-containing gas, in place of the O2 gas. Note, however, that the hydrogen peroxide is different from the water vapor (water, H2O) in that it has higher activation energy and more oxygen atoms in one molecule than the water vapor, yielding high oxidative power. Thus, the use of the hydrogen peroxide gas is advantageous in that it allows oxygen atoms (O) to reach the depths of the films formed on the grooves (the bottoms of the grooves) of the wafers 200. Additionally, the use of the hydrogen peroxide enables the modification process to be performed at low temperatures from 40° C. to 100° C., and thereby performance degradation of circuits formed on the wafers 200, circuits made with a material (aluminum, for example) susceptible to high-temperature processing in particular, can be suppressed.

In a case where a gas generated by vaporizing water (H2O) (water vapor gas) is used as the oxidant, the gas (processing gas) supplied onto the wafers 200 may contain H2O molecules not bonded and clusters of some H2O molecules bonded together. Additionally, when water (H2O) in the liquid state is converted to the gaseous state, the water may be split into unbonded H2O molecules or into clusters of some H2O molecules bonded. The gas may include mist formed with such clusters gathered together.

In a case where a hydrogen peroxide solution (H2O2) is used as the oxidant, the gas supplied onto the wafers 200 may similarly contain H2O2 molecules not bonded and clusters of some H2O2 molecules bond together. Additionally, when the hydrogen peroxide solution (H2O2) is turned to the hydrogen peroxide gas, the solution may be split into unbonded H2O2 molecules or into clusters of some H2O2 molecules bonded. The gas may include mist formed with such clusters gathered together.

A hydrogen peroxide gas, which serves as the processing gas, is generated in the reaction tube 203 in the embodiment described above, but the invention is not limited thereto. A hydrogen peroxide gas may be generated through vaporization outside the reaction tube 203 before it is supplied through the supply nozzle 230 into the reaction tube 203. This allows the atmosphere of the hydrogen peroxide gas in the reaction tube 203 to be further uniform. Note, however, that the hydrogen peroxide gas may re-liquefy in the supply nozzle 230 during the passage therein in this case. The hydrogen peroxide gas would often build up at a curve (bend) and a joint in the supply nozzle 230 to re-liquefy. As a result, a liquid resulting from the re-liquefaction in the supply nozzle 230 may damage the inside of the supply nozzle 230.

The processing furnace 202 described above may be provided with a first external temperature sensor 264a, a second external temperature sensor 264b, a third external temperature sensor 264c, and a fourth external temperature sensor 264d (see FIG. 2), which may be thermocouples, outside the reaction tube 203 to serve as temperature sensing devices to detect the temperatures of the first heater unit 207a, the second heater unit 207b, the third heater unit 207c, and the fourth heater unit 207d included in the first heater 207, respectively. The first external temperature sensor 264a, the second external temperature sensor 264b, the third external temperature sensor 264c, and the fourth external temperature sensor 264d are each connected to the controller 121. In this manner, the temperatures of the first heater unit 207a, the second heater unit 207b, the third heater unit 207c, and the fourth heater unit 207d can be monitored to see whether these units are each heated to a predetermined temperature on the basis of the temperature information detected by the first external temperature sensor 264a, the second external temperature sensor 264b, the third external temperature sensor 264c, and the fourth external temperature sensor 264d.

A process, such as annealing (heat processing), may be performed between the purge process (S40) and the temperature drop/atmospheric pressure restoration process (S50) according to the embodiment described above to, for example, heat the wafers 200 to high temperatures from 800° C. to 1000° C. In a case where such annealing is performed, the shutter 252 may be opened, during the temperature drop/atmospheric pressure restoration process (S50) as described above, to supply N2 gas, which serves as a cooling gas, through the cooling gas supply pipe 249 into the space 260 between the reaction tube 203 and the thermal insulating member 210 while the temperatures of the wafers 200 are allowed to drop. In this manner, the reaction tube 203 and the first heater 207 positioned in the space 260 can be cooled in a shorter period of time. As a result, the subsequent modification process (S30) can be started at an earlier time, and thereby the throughput can be improved.

Although the substrate processing apparatus according to the embodiment described above includes the vertical processing furnace, the invention is not limited thereto. The invention may also be suitably applied to other types of substrate processing apparatus including other types of processing furnace, such as a single-wafer processing type, hot wall type, and cold wall type processing furnaces, and also to a type of substrate processing apparatus that excites a processing gas to process the wafers 200, such as an MMT apparatus.

The sealing cap 219, which serves as the lid, may be made with a non-metallic material having high thermal conductivity, such as silicon carbide (SiC), aluminum oxide (AlO), aluminum nitride (AlN), silicon nitride (SiN), zirconium oxide (ZrO). A non-metallic material with thermal conductivity not less than 10 W/mK in particular may be used. The sealing cap 219 may be made with metal, such as stainless steel (SUS), or quartz. In a case where the sealing cap 219 is made with metal, the metal materials are preferably coated with Teflon (registered trademark).

In a case where the sealing cap 219 is made with a material having high thermal conductivity, the sealing cap 219 is likely to be heated by the second heater 208, and, thus, the temperature of the sealing cap 219 can be raised in a shorter period of time. Hence, when the hydrogen peroxide gas comes in contact with the sealing cap 219, the cooling of the hydrogen peroxide gas below the vaporizing point and the resultant re-liquefaction of the hydrogen peroxide gas on the sealing cap 219 can be suppressed. In a case where the sealing cap 219 is made with a non-metallic material, damage to the sealing cap 219 can be reduced even if a liquid resulting from the re-liquefaction has collected on the sealing cap 219.

Figure 6:
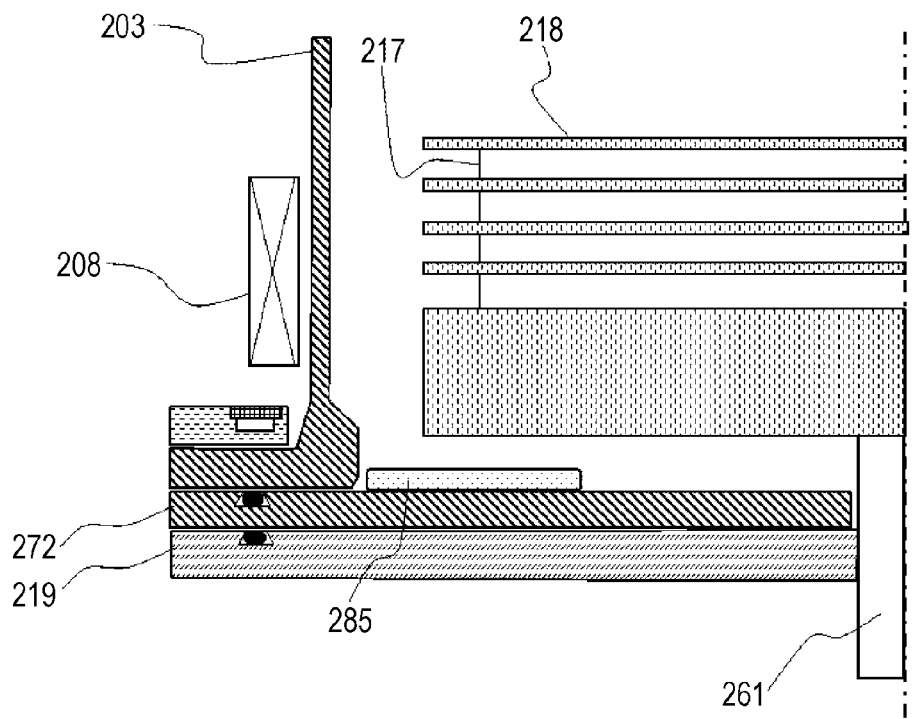
FIG. 6 is a schematic diagram of an arrangement near the furnace opening according to still another embodiment of the invention.
Figure 7:
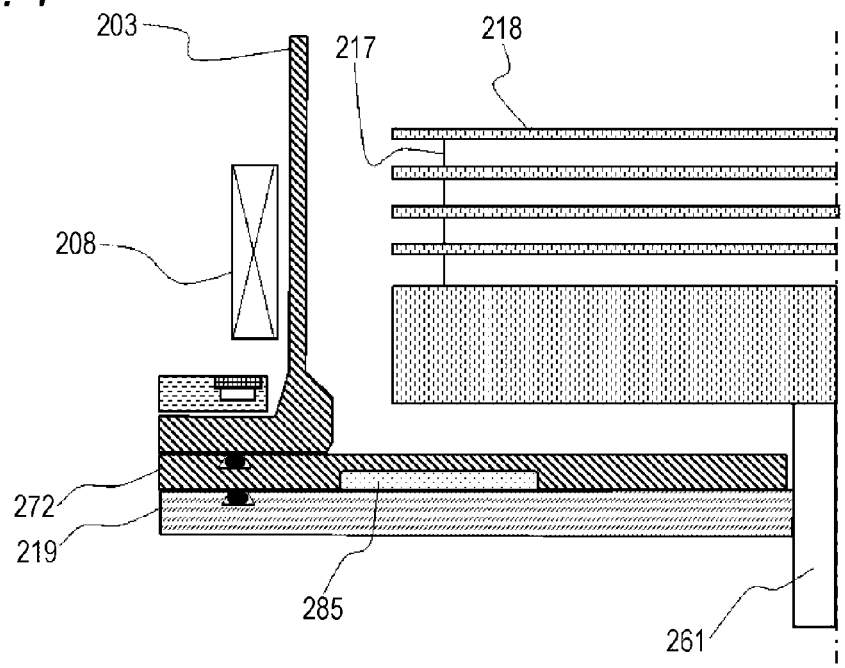
FIG. 7 is a schematic diagram of an arrangement near the furnace opening according to still another embodiment of the invention.
Figure 8:
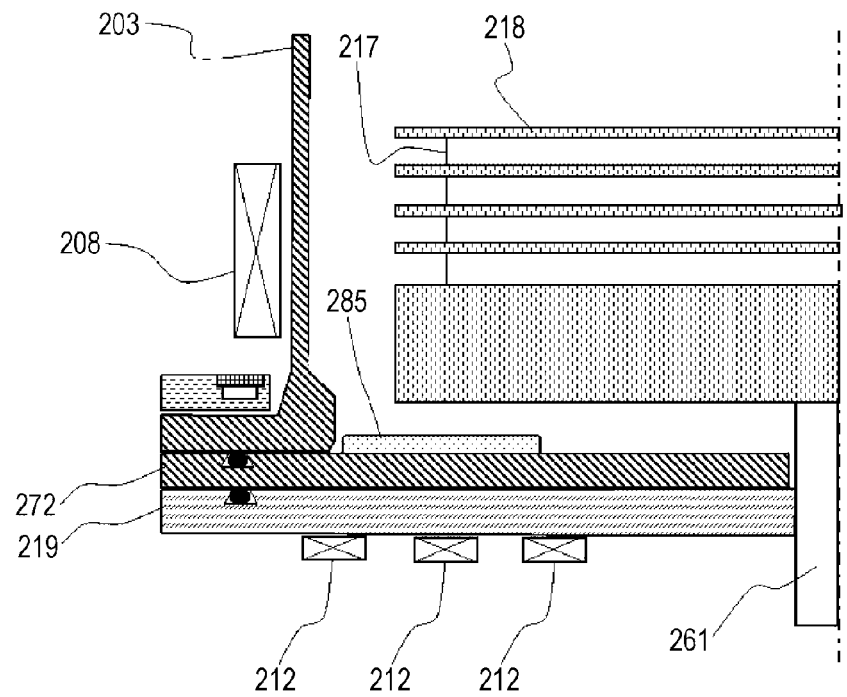
FIG. 8 is a schematic diagram of an arrangement near the furnace opening according to still another embodiment of the invention.

By providing a sealing-cap protector 272 on the sealing cap 219 made with a stainless steel, the contact between the sealing cap and the hydrogen peroxide can be prevented, and, thus, the reaction can be suppressed. A plate made with quartz, for example, can be provided as the sealing-cap protector 272. By further providing a thermal conductor 285 on the quartz plate on its upper surface, as illustrated in FIG. 6, the heating efficiency of the top of the sealing cap can be improved. The thermal conductor 285 may be a non-metallic plate made with the type of non-metallic material described above. By placing the thermal conductor 285 between the quartz plate and the sealing cap, as illustrated in FIG. 7, the heating efficiency of the sealing cap can be improved while the contact between the sealing cap and the hydrogen peroxide is suppressed. The thermal conductor 285 may be provided on the sealing-cap protector 272 on its upper surface and/or its lower surface. It is more preferable that the thermal conductor 285 be placed on the sealing-cap protector 272 on its upper surface and that the heating elements 212 be placed at a lower side of the sealing-cap protector 272, as illustrated in FIG. 8, in order to improve the heating efficiency at the furnace opening. To prevent the wafers 200 from being heated by the second heater 208 when the wafers 200 are loaded and unloaded into/from the reaction tube 203, the second heater 208 is turned off, so that the temperature of the surroundings of the second heater 208 is allowed to drop. The provision of the thermal conductor 285 and the heating elements 212, however, enables the sealing cap 219 to be heated during the loading and unloading of the wafers 200, reducing the period of time taken for the temperature at the furnace opening to rise and thereby improving the throughput.

Although the wafers 200 with polysilazane films formed thereon are processed in the example described above, the invention is not limited thereto. Silicon-containing films formed through the CVD method can be oxidized through the processes described above.

Preferred Aspects of the Invention

Some preferred aspects of the invention will be described in supplementary notes below.

<Supplementary Note 1>

In an aspect of the invention, a substrate processing apparatus is provided, the apparatus including:

a processing vessel configured to accommodate a substrate;

a lid configured to close the processing vessel;

a supply module configured to supply a reactant to the substrate;

a first heater configured to heat the substrate; and a second heater configured to heat the reactant in the gaseous state flowing near the lid.

<Supplementary note 2>

In the substrate processing apparatus described in the supplementary note 1, the second heater preferably includes a resistance heating body and/or a radiation heating body.

<Supplementary note 3>

In the substrate processing apparatus described in the supplementary note 1 or 2, the second heater preferably heats an area outside an area heated by the first heater.

<Supplementary note 4>

The substrate processing apparatus described in any one of the supplementary notes 1 to 3 preferably includes a control unit configured to control the temperature of the second heater so that the liquefaction of the reactant in the gaseous state in the processing vessel is suppressed.

<Supplementary note 5>

In the substrate processing apparatus described in any one of the supplementary notes 1 to 4, the processing vessel is preferably a reaction tube configured to accommodate a plurality of substrates, and the second heater is preferably placed at least outside a lower portion of the reaction tube.

<Supplementary note 6>

In the substrate processing apparatus described in any one of the supplementary notes 1 to 5, the second heater is preferably embedded in the lid.

<Supplementary note 7>

In the substrate processing apparatus described in any one of the supplementary notes 1 to 6, the second heater is preferably placed outside and below the lid.

<Supplementary note 8>

In the substrate processing apparatus described in any one of the supplementary notes 1 to 7, the lid is preferably made with a non-metallic material having high thermal conductivity.

<Supplementary note 9>

In the substrate processing apparatus described in any one of the supplementary notes 1 to 8, the reactant is preferably solid or liquid at ordinary temperatures and a solution containing the reactant dissolved in a solvent is vaporizable.

<Supplementary note 10>

In the substrate processing apparatus described in the supplementary note 9, the reactant preferably has a vaporizing point different from that of the solvent.

<Supplementary note 11>

In the substrate processing apparatus described in any one of the supplementary notes 1 to 10, the reactant in the liquid state is preferably supplied into the processing vessel to be vaporized into the gaseous state in the processing vessel.

<Supplementary note 12>

In the substrate processing apparatus described in any one of the supplementary notes 1 to 11, the processing vessel is preferably provided with an exhaust module and a state converter, and, in a case where the reactant in the liquid state is supplied into the processing vessel, the reactant in the liquid state is preferably converted to the gaseous state by the state converter in the processing vessel and, then, flows in the processing vessel toward the exhaust module.

<Supplementary note 13>

The substrate processing apparatus described in any one of the supplementary note 1 to 10, the reactant is preferably vaporized into the gaseous state outside the processing vessel and then supplied into the processing vessel.

<Supplementary note 14>

In another aspect of the invention, a method of manufacturing a semiconductor device is provided, the method including:

heating a substrate accommodated in a processing vessel with a first heater;

supplying a reactant into the processing vessel; and heating, with a second heater, the reactant in the gaseous state flowing near a lid that closes the processing vessel.

<Supplementary note 15>

The method of manufacturing a semiconductor device described in the supplementary note 14 preferably includes a process of controlling the second heater so as to suppress the liquefaction of the reactant in the gaseous state in the processing vessel.

<Supplementary note 16>

In yet another aspect of the invention, a program is provided, the program being configured to cause a computer to execute: a procedure of heating a substrate accommodated in a processing vessel with a first heater;

a procedure of supplying a reactant into the processing vessel; and a procedure of heating, with a second heater, the reactant in the gaseous state flowing near a lid that closes the processing vessel.

<Supplementary note 17>

In still another aspect of the invention, a program is provided, the program being configured to cause a computer to execute: a procedure of loading a substrate into a processing vessel;

a procedure of heating the substrate in the processing vessel with a first heater and supplying a reactant through a supply module into the processing vessel to process the substrate; and a procedure of unloading the processed substrate from the processing vessel, wherein the procedure of processing the substrate includes a procedure of heating the reactant in the gaseous state in the processing vessel at its downstream side with a second heater so as to suppress the liquefaction in the processing vessel of the reactant in the gaseous state flowing from the supply module in the processing vessel to an exhaust module.

<Supplementary note 18>

In still another aspect of the invention, a non-transitory computer-readable recording medium is provided, the recording medium having stored a program including:

a procedure of loading a substrate into a processing vessel;

a procedure of heating the substrate in the processing vessel with a first heater and supplying a reactant through a supply module into the processing vessel to process the substrate; and a procedure of unloading the processed substrate from the processing vessel, wherein, in the procedure of processing the substrate, the reactant in the gaseous state is heated in the processing vessel at its downstream side with a second heater so that the liquefaction in the processing vessel of the reactant in the gaseous state flowing from the supply module in the processing vessel to an exhaust module is suppressed.

The substrate processing apparatus, the method of manufacturing a semiconductor device, and the non-transitory computer-readable recording medium according to the invention achieve improved manufacturing quality of the semiconductor device with improved manufacturing throughput.

FIG. 2
COOLING WATER
FIG. 9
123: EXTERNAL MEMORY DEVICE
122: INPUT/OUTPUT DEVICE
121c: MEMORY DEVICE
121d: I/O PORT
234: LIQUID MASS FLOW CONTROLLER
239b to 239e, 251: MASS FLOW CONTROLLER
235a to 235e, 237, 240: VALVE
252, 254, 256: SHUTTER
242: APC VALVE
246a, 246b: VACUUM PUMP
207: FIRST HEATER
208: SECOND HEATER
209: THIRD HEATER
263a to 263d: TEMPERATURE SENSOR
267: BOAT ROTATING MECHANISM
259: BLOWER ROTATING MECHANISM
FIG. 10
START
S10: SUBSTRATE LOADING PROCESS
S20: PRESSURE/TEMPERATURE ADJUSTMENT PROCESS
S30: MODIFICATION PROCESS
S40: PURGE PROCESS
S50: TEMPERATURE DROP/ATMOSPHERIC PRESSURE RESTORATION PROCESS
S60: SUBSTRATE UNLOADING PROCESS
END

What is claimed is:

1. A substrate processing apparatus, comprising:
a reaction tube configured to accommodate a plurality of substrates and to be supplied with a gas generated by one of vaporizing or turning into mist a solution containing a reactant dissolved in a solvent;
a lid configured to close the reaction tube and including a plate-shaped lid protector inside the reaction tube, the lid protector being configured to prevent the lid from coming in contact with the reactant;
a first heater configured to heat the plurality of substrates;
a thermal conductor placed on an upper surface of the lid such that a lower planar surface thereof contacts the upper surface of the lid protector;
a second heater placed around an outer circumference of a lower portion of the reaction tube and surrounding a sidewall surface thereof concentrically, the second heater being configured to heat the lid and the gas flowing near the lid; and
a heating element placed on the lid on a lower surface thereof, the heating element being configured to heat the lid.

2. The substrate processing apparatus according to claim 1, wherein the reactant is hydrogen peroxide $H_2O_2$ and the solvent is water $H_2O$.

3. The substrate processing apparatus according to claim 1, wherein the reactant and the solvent have mutually different vaporizing points.

4. The substrate processing apparatus according to claim 1, wherein the lid protector is a plate made with quartz.

5. The substrate processing apparatus according to claim 1, wherein the second heater is made with one or both of a resistance heating body or a radiation heating body.

6. The substrate processing apparatus according to claim 1, wherein the second heater heats an area outside an area heated by the first heater.

7. The substrate processing apparatus according to claim 1, further comprising a control unit configured to control temperatures of the second heater and the heating element so that liquefaction of the gas in the reaction tube is suppressed.

8. The substrate processing apparatus according to claim 1, wherein the lid is made with a non-metallic material having thermal conductivity not less than 10 W/mK.

9. The substrate processing apparatus according to claim 1, wherein the lid is made with one of silicon carbide (SiC), aluminum oxide (AlO), aluminum nitride (AlN), silicon nitride (SiN), or zirconium oxide (ZrO).

10. The substrate processing apparatus according to claim 1, wherein the reaction tube is provided with a third heater and a state converter, and the solution, in a liquid state thereof, containing the reactant dissolved in the solvent is supplied into the reaction tube and then turned to a gaseous state thereof in the reaction tube by the third heater and the state converter.

11. A method of manufacturing a semiconductor device comprising:
   providing a substrate processing apparatus comprising: a reaction tube configured to accommodate a plurality of substrates; a lid configured to close the reaction tube and including a plate-shaped lid protector inside the reaction tube, the lid protector being configured to prevent the lid from coming in contact with the reactant; a first heater configured to heat the plurality of substrates; a thermal conductor placed on an upper surface of the lid such that a lower planar surface thereof contacts the upper surface of the lid protector; a second heater placed around an outer circumference of the reaction tube and surrounding a sidewall surface thereof concentrically; and a heating element placed on the lid on a lower surface thereof, the heating element being configured to heat the lid;
   heating the plurality of substrates accommodated in the reaction tube with the first heater; and
   supplying in the reaction tube a gas generated by one of vaporizing or turning into mist a solution containing a reactant dissolved in a solvent, wherein the second heater and the heating element are controlled to have temperatures at which liquefaction of the gas flowing near the lid is prevented.

12. The method of manufacturing a semiconductor device according to claim 11, wherein in the supplying of the reactant in the reaction tube, the reactant in a liquid state thereof is supplied into the reaction tube and vaporized by a third heater and a state converter provided at the reaction tube.

13. A non-transitory computer-readable recording medium for use with a substrate processing apparatus, the apparatus comprising:
   a reaction tube configured to accommodate a plurality of substrates; a lid configured to close the reaction tube and including a plate-shaped lid protector inside the reaction tube, the lid protector being configured to prevent the lid from coming in contact with the reactant; a first heater configured to heat the plurality of substrates; a thermal conductor placed on an upper surface of the lid such that a lower planar surface thereof contacts the upper surface of the lid protector; a second heater placed around an outer circumference of the reaction tube and surrounding a sidewall surface thereof concentrically; and a heating element placed on the lid on a lower surface thereof, the heating element being configured to heat the lid,
   the recording medium having stored a program configured to cause a computer to execute:
   a procedure of heating the plurality of substrates accommodated in the reaction tube with the first heater; and
   a procedure of supplying in the reaction tube a gas generated by one of vaporizing or turning into mist a solution containing a reactant dissolved in a solvent, wherein the second heater and the heating element are controlled to have temperatures at which liquefaction of the gas flowing near the lid is prevented.

14. The non-transitory computer-readable recording medium according to claim 13, wherein the procedure of supplying the gas in the reaction tube includes a procedure of supplying the solution containing the reactant dissolved in the solvent into the reaction tube and vaporizing the solution with a third heater and a state converter provided at the reaction tube.

* * * * *